United States Patent
Kanome et al.

(10) Patent No.: US 9,437,637 B2
(45) Date of Patent: Sep. 6, 2016

(54) SEMICONDUCTOR DEVICE MANUFACTURING METHOD AND RESIST PATTERN FORMING METHOD

(71) Applicant: CANON KABUSHIKI KAISHA, Tokyo (JP)

(72) Inventors: Atsushi Kanome, Tokyo (JP); Nobutaka Ukigaya, Yokohama (JP); Koji Hara, Ichikawa (JP); Satoshi Yoshizaki, Tachikawa (JP); Masahiko Kondo, Hiratsuka (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 14/681,350

(22) Filed: Apr. 8, 2015

(65) Prior Publication Data

US 2015/0301454 A1 Oct. 22, 2015

(30) Foreign Application Priority Data

Apr. 16, 2014 (JP) .................................. 2014-084963
Mar. 24, 2015 (JP) .................................. 2015-061661

(51) Int. Cl.
| | |
|---|---|
| *H01L 21/266* | (2006.01) |
| *H01L 27/146* | (2006.01) |
| *G03F 7/00* | (2006.01) |
| *G03F 7/40* | (2006.01) |

(52) U.S. Cl.
CPC ......... *H01L 27/1463* (2013.01); *G03F 7/0035* (2013.01); *G03F 7/40* (2013.01); *H01L 27/1461* (2013.01); *H01L 27/14643* (2013.01); *H01L 27/14689* (2013.01)

(58) Field of Classification Search
CPC ................................................ H01L 27/14689
See application file for complete search history.

(56) References Cited

U.S. PATENT DOCUMENTS 6,436,772 B2   8/2002   Otsuki
2001/0051418 A1*  12/2001   Otsuki .................. H01L 21/266
                                                          438/587
2003/0215752 A1   11/2003   Ono et al.

FOREIGN PATENT DOCUMENTS

| JP | 60-234322 A | 11/1985 |
|---|---|---|
| JP | 4-146617 A | 5/1992 |
| JP | 2001-351992 A | 12/2001 |
| JP | 2002-217123 A | 8/2002 |
| JP | 2003-332212 A | 11/2003 |
| JP | 2006-073611 A | 3/2006 |
| JP | 2011-248306 A | 12/2011 |
| JP | 2013-232576 A | 11/2013 |

* cited by examiner

*Primary Examiner* — Daniel Shook
(74) *Attorney, Agent, or Firm* — Fitzpatrick, Cella, Harper & Scinto

(57) ABSTRACT

A method for manufacturing a semiconductor device comprising, forming a first photoresist pattern by exposing and then developing a first photoresist film formed on a substrate, irradiating the first photoresist pattern with UV light to cure its surface, forming a second photoresist film so as to cover the substrate and the first photoresist pattern, forming a second photoresist pattern and performing ion implantation in the substrate using the second photoresist pattern. The second photoresist pattern is not subjected to UV irradiation after the second photoresist film has been developed and before the ion implantation is performed, or is irradiated with the UV light, after the second photoresist film has been developed and before the ion implantation is performed, under a reduced condition relative to that for the first photoresist pattern.

10 Claims, 9 Drawing Sheets

SEMICONDUCTOR DEVICE MANUFACTURING METHOD AND RESIST PATTERN FORMING METHOD

BACKGROUND OF THE INVENTION

1. Field of the Invention

The present invention relates to a method for manufacturing a semiconductor device and a method for forming a resist pattern.

2. Description of the Related Art

There is a strong demand for a photoelectric conversion device having a high sensitivity. As a method that satisfies the demand, there is a method for forming a photoelectric conversion section to a position deep in a silicon substrate. According to this method, an impurity needs to be implanted to the position that is deeper than ever. Therefore, an ultrahigh energy implantation machine that can perform ion implantation to a silicon substrate with energy higher than 1 MeV has been promoted for practical use.

On the other hand, in order to perform ion implantation to a specific position on a silicon substrate, a well-known mask with a resist is used. The material of this mask needs to have at least a sufficient ion stopping ability against implantation energy. Ordinarily, a mask material for stopping the implantation energy needs to be formed so as to have a larger thickness as the implantation energy is higher. Particularly, when ion implantation with the above-described ultrahigh energy is performed, a mask material needs to be formed so as to have a larger thickness in order to satisfy a sufficient ion stopping ability as a mask material.

Japanese Patent Laid-Open No. 2002-217123 discloses that, when boron ion implantation energy is 4 MeV, the implantation depth is about 3 µm and a mask material needs to have a thickness of about 7 µm for ensuring the stopping ability as a mask material. It is furthermore disclosed that, when boron ion implantation energy is 5 MeV, the implantation depth is about 5 µm and a mask material needs to have a thickness of about 10 µm for ensuring the stopping ability as a mask material. In order to form a mask material having a sufficient ion stopping ability, Japanese Patent Laid-Open No. 2002-217123 discloses a method for forming a silicon layer having a thickness that is larger than 10 µm as a mask material.

Furthermore, as an alternative method, there is a method in which a photoresist is used as a mask material and formed so as to have a large thickness. For example, a method is known for stacking resists to form a mask material, which as well makes it possible for the thickness of the mask material to be large. The method for stacking resists is known from Japanese Patent Laid-Open No. 2006-73611.

SUMMARY OF THE INVENTION

However, in the method disclosed in Japanese Patent Laid-Open No. 2002-217123, a process for etching the silicon layer, serving as a mask material, using a photoresist mask is needed in order to pattern the silicon layer. For formation of the photoresist mask, a photoresist layer is applied to the silicon layer, and the applied photoresist layer is subjected to exposure and development processing to form the photoresist mask. Such a process for forming a mask material for ion implantation using photo-etching is complicated, resulting in a deterioration in workability.

In Japanese Patent Laid-Open No. 2006-73611, although a process for forming a two-layer photoresist mask is disclosed, a photoresist mask for ultrahigh energy ion implantation is not taken into consideration.

In contrast, it is an aspect of the present invention to enable a highly reliable mask material to be formed in a simple process and to provide a method for manufacturing a semiconductor device using such a mask.

According to some embodiments, a method for manufacturing a semiconductor device is provided. The method comprises a first step of forming a first photoresist film on a substrate, a second step of forming a first photoresist pattern by exposing and then developing the first photoresist film, a third step of irradiating the first photoresist pattern with ultraviolet light to cure a surface of the first photoresist pattern, a fourth step of forming a second photoresist film so as to cover the substrate and the first photoresist pattern, a fifth step of forming a second photoresist pattern at least a part of which is provided on the first photoresist pattern by exposing and then developing the second photoresist film, and a sixth step of performing ion implantation in the substrate using the second photoresist pattern. In the above method, the second photoresist pattern is not subjected to ultraviolet irradiation after the second photoresist film has been developed and before the ion implantation is performed, or the second photoresist pattern is irradiated with the ultraviolet light, after the second photoresist film has been developed and before the ion implantation is performed, under a condition that at least one of an ultraviolet light irradiation amount, an ultraviolet light irradiation time, and an atmospheric temperature at the time of ultraviolet irradiation is reduced relative to that in the third step.

Further features of the present invention will become apparent from the following description of exemplary embodiments (with reference to the attached drawings).

DESCRIPTION OF THE EMBODIMENTS

Embodiment 1

Hereinafter, a photoelectric conversion device serving as a semiconductor device according to Embodiment 1 of the present invention will be described with reference to the drawings. In the present embodiment, a CMOS-type photoelectric conversion device will be described, but the type of the photoelectric conversion device is not limited to this. Furthermore, the present embodiment is also applicable to another semiconductor device.

The photoelectric conversion device that is described in the present embodiment has a pixel array region and a peripheral region. The pixel array region is a region in which a plurality of pixels is arrayed. The peripheral region is a region that is arranged in the periphery of the pixel array region and in which a plurality of control circuits including a MOS transistor for controlling the plurality of pixels, and circuits that serve as read paths are arranged.

In the pixel array region, the plurality of pixels is arrayed in row and column directions. Each pixel includes, for example, a photoelectric conversion section, a transfer transistor, a charge voltage conversion section, a reset section, an output section, and a selection section. Furthermore, in the peripheral region, the plurality of control circuits is arranged. The plurality of control circuits include a vertical scanning circuit, a constant current source block, a column amplifier block, a holding capacitance block, a horizontal scanning circuit, and an output amplifier block.

Note that in the present embodiment, an ion implantation process for forming an impurity region that is arranged in the pixel array region of the photoelectric conversion device will be described.

Figure 1:
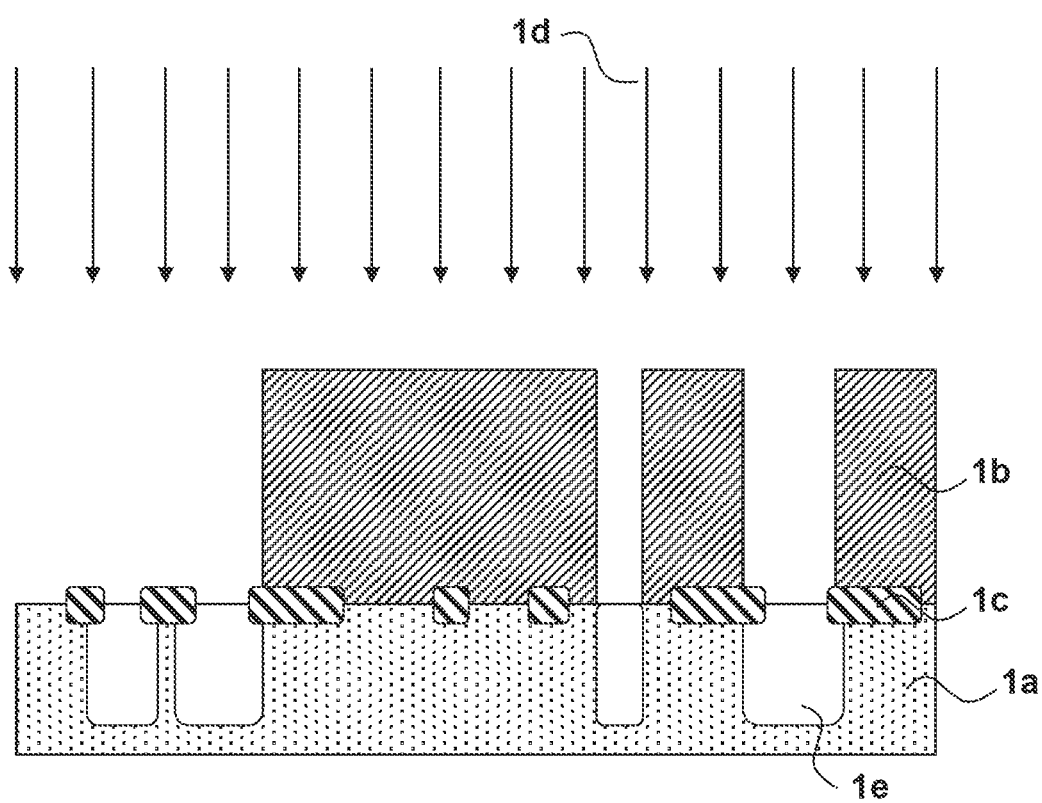
FIG. 1 schematically illustrates a method for manufacturing a semiconductor device according to embodiments of the present invention.

In the drawings for use in the description below, for ease of description, main parts of the pixel array region, a peripheral circuit, and a non-effective region will be described, but it is assumed that parts that are not described, such as circuits, are also formed by an ordinary method for manufacturing a photoelectric conversion device. FIG. 1 is a cross-sectional view specifically showing an example of ultrahigh energy implantation (boron B and energy of 6 MeV) in an ion implantation process for forming a well that is arranged in the portion to serve as the pixel array region of the photoelectric conversion device according to Embodiment 1 of the present invention.

FIG. 1 shows the situation in which a resist layer $1b$ having openings is provided on a substrate $1a$ in a predetermined pattern and an ion $1d$ is implanted through the openings to form wells $1e$ in the substrate $1a$. The resist layer $1b$ is a resist mask formed by a resist pattern forming method that corresponds to the embodiments of the present invention that will be described with reference to FIG. 2 onward. An element isolation portion $1c$ is a region that is formed for preventing a part of an electrical charge generated in a pixel by photoelectric conversion from being mixed into an adjacent pixel or element. The element isolation portion $1c$ can include an isolation structure that is made from an insulating material by, for example, an STI method, a LOCOS method or the like, an isolation structure using a PN junction, and the like. The isolation using a PN junction refers to isolation having a structure that includes an impurity region serving as a potential barrier against a signal charge. This potential barrier can also be formed using a resist pattern that is formed by a processing method corresponding to the embodiments of the present invention that will be described below. Note that the thickness of the resist mask that needs a sufficient ion stopping ability against the above-described implantation energy is about 9 µm. Hereinafter, an ion implantation process using such a resist mask having a significantly large thickness will be described in detail.

FIG. 2 shows processes of a resist mask forming method, in a semiconductor device manufacturing method according to the embodiments of the present invention, in order of processes.

Figure 2A:
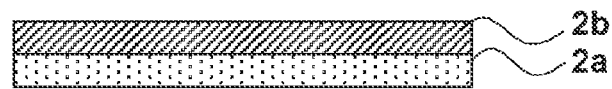
FIGS. 2A to 2F show processes for forming a resist pattern according to Embodiments 1 and 2 of the present invention.
Figure 2B:
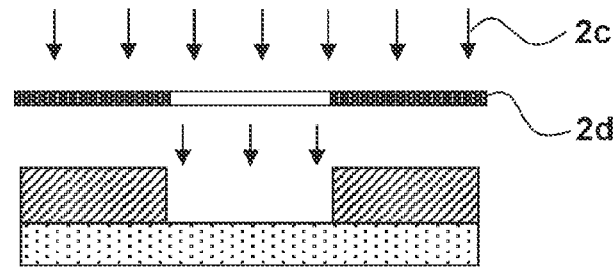

First, as shown in FIG. 2A, a photoresist is applied to a substrate to form a first photoresist film $2b$. Then, as shown in FIG. 2B, a part of the first photoresist film $2b$ is exposed by blocking exposure light $2c$ using a reticle $2d$ that has an opening at the position at which an ion is desired to be implanted deeply and that corresponds to the position of an impurity region that is to be formed in the substrate. Then, the first photoresist film $2b$ is developed to create a pattern. At that time, a high yield for formation of the resist mask is achieved by, instead of forming the first photoresist film $2b$ having the thickness of 9 µm at a time, dividing the formation into two processes in each of which a photoresist having the thickness of 5.5 µm or smaller is applied, the thicknesses being summed up to 9 µm or greater. Note that the formation is here divided into two processes, but the number of times of application in a divided manner is not limited to two times, and may also be three times or more. Note that any commercially available material may be used as a material that is used as the photoresist.

Figure 2C:
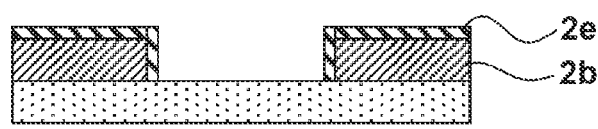
Figure 2D:
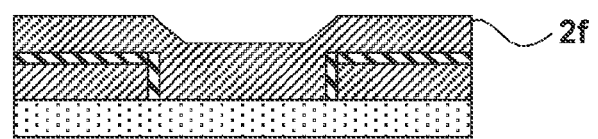
Figure 2E:
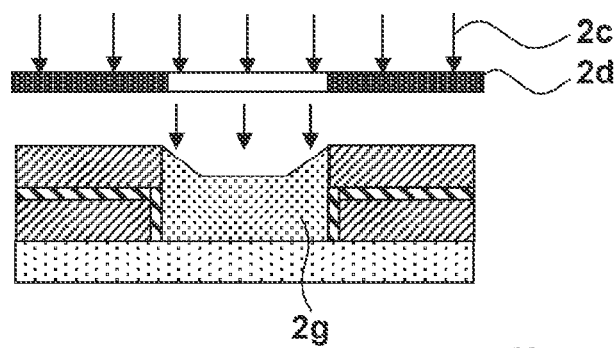

After the first photoresist film $2b$ serving as a first photoresist pattern formed in the first formation process has been developed, the first photoresist film $2b$ is subjected to ultraviolet curing (UV curing) processing. The ultraviolet curing processing can be executed under the condition, for example, that an atmospheric temperature is increased to 170° C. while irradiating the first photoresist film $2b$ for 60 seconds with ultraviolet rays having an irradiation intensity of 900 W/cm$^2$ or less. The conditions of the ultraviolet curing processing are not limited to those disclosed here, and the ultraviolet curing processing may also be executed under the condition of the irradiation intensity in the range from 800 to 1000 W/cm$^2$, and the atmospheric temperature in the range from 130 to 200° C., for example. This ultraviolet curing processing promotes degasifying of the first photoresist film $2b$, making it possible to suppress deformation due to the pressure and thermal environment in the next process. FIG. 2C shows the situation that a cured portion $2e$ is formed and thus the surface of the first photoresist film $2b$ is cured. By suppressing the thickness of the first photoresist film to 5.5 µm or smaller, it is also possible to prevent the photoresist from being deformed during the ultraviolet curing (UV curing).

Note that if the thickness of the first photoresist film $2b$ is 7 µm or greater, a crack occurs on the surface or the like of the first photoresist film $2b$ in a thermal processing process (for example, a post-bake process) or an ion implantation process in a reduced-pressure atmosphere after the curing processing and a yield is reduced. Since the stopping ability as a mask material is deteriorated at a position at which the crack occurred, the implanted ion passes through an unintended region via the crack position, which may affect the characteristics of the photoelectric conversion device, as a result. For example, there may be the problem that a short circuit occurs between adjacent interconnects. One of the reasons why such a crack occurs in a photoresist may be that dewatering processing for removing water contained in the photoresist is not sufficient.

The ultraviolet curing processing is processing that is performed for preventing this crack, but may cause deformation of the photoresist. The reason of the deformation may be that although the photoresist contains, due to its large film thickness, a large amount of volatile or sublimate, the volatile is not likely to escape out of the photoresist since the surface of the photoresist is cured, and a large stress is applied to the surface of the photoresist. Examples of deformation due to this stress include a phenomenon called as hopping in which a part of the resist is pushed and removed out. Such hopping is likely to occur during the ultraviolet curing processing when the thickness of the photoresist is 5.5 µm or greater, particularly, 7 µm or greater. Accordingly, it is advantageous for the photoresist to have a film thickness that is smaller than the above-described value. The reason why hopping (deformation) occurs in the photoresist particularly having a large film thickness is that the photoresist includes a large amount of gas composition. Therefore, the surface layer of the photoresist is cured during the ultraviolet curing processing in the state in which degasifying of the photoresist is insufficient, and hopping occurs during the processing.

Figure 2F:
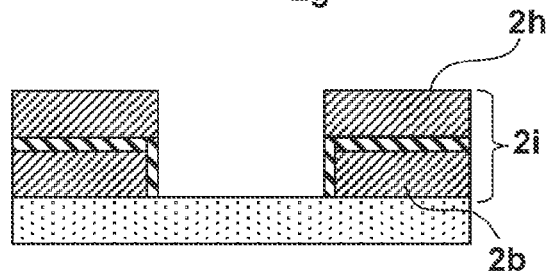
Figure 3A:
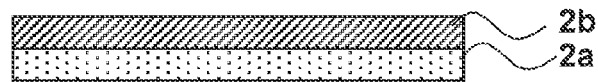
FIGS. 3A to 3F show processes for forming a resist pattern according to Embodiment 3 of the present invention.
Figure 3B:
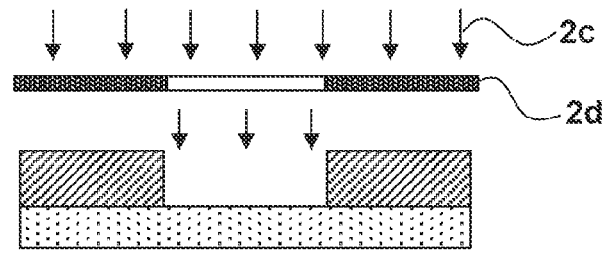
Figure 3C:
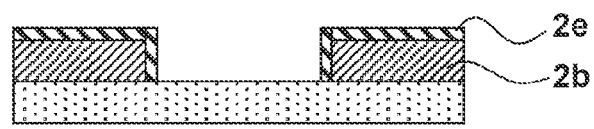
Figure 3D:
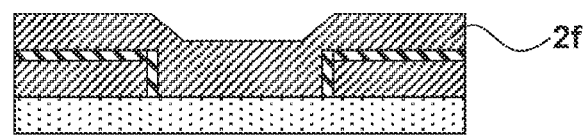
Figure 3E:
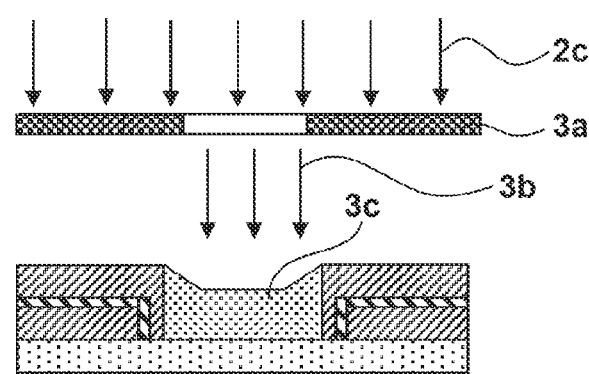
Figure 3F:
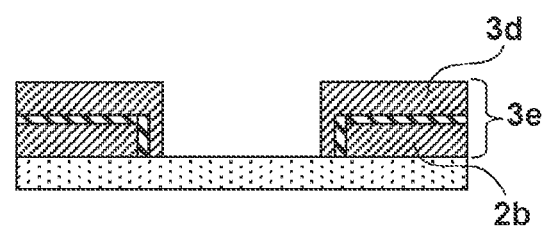
Figure 4A:
FIGS. 4A to 4F show processes for forming a resist pattern according to Embodiment 4 of the present invention.
Figure 4B:
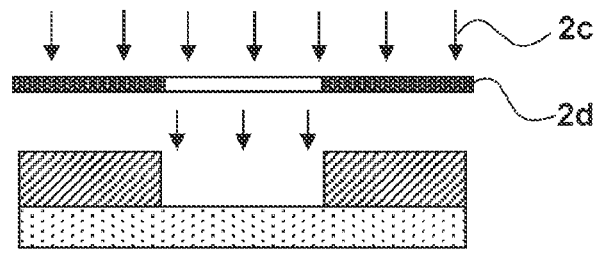
Figure 4C:
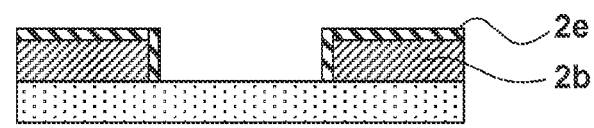
Figure 4D:
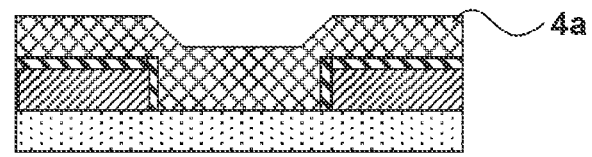
Figure 4E:
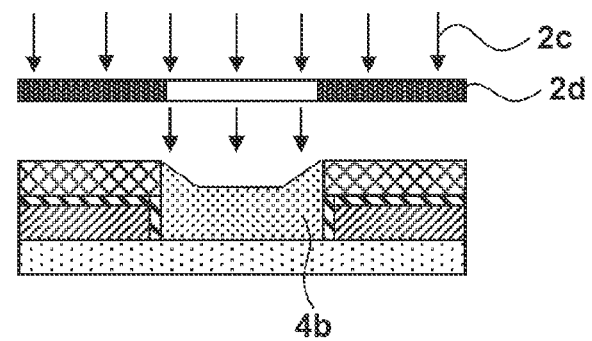
Figure 4F:
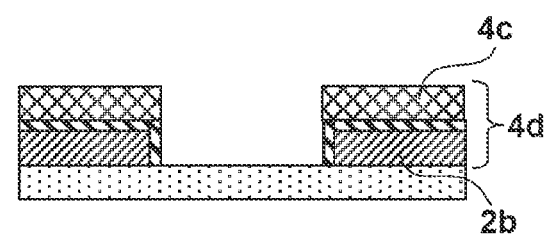

After having subjected to ultraviolet curing by the above-described processing, the first layer may be subjected to Hexamethyldisilazane (HMDS) processing. With this processing, when a photoresist serving as a second layer is applied, it is possible to improve the adhesiveness of the second photoresist to the lower layer. Then, in order to form a photoresist film serving as the second layer, the same photoresist as the first layer is again applied to the first layer under the same application condition to form a second photoresist film 2f (see FIG. 2D), and the second photoresist film 2f is exposed using the same reticle 2d (see FIG. 2E). Accordingly, a part 2g of the second photoresist film is exposed to light, and thus development processing is then performed. With this measure, a second photoresist pattern 2h shown in FIG. 2F is formed, and a resist pattern 2i having the film thickness of, for example, 9 µm can be formed. Note that the second photoresist film serving as the second layer is not subjected to ultraviolet curing processing, in contrast to the first layer. This is to avoid hopping that may be caused by the ultraviolet treatment due to residual gas in the first photoresist film (pattern) serving as the first layer. Note that formation of a resist pattern having a large film thickness can be realized by providing at least a part of the second photoresist pattern 2h on the first photoresist pattern.

When the resist pattern 2i having the thickness of 9 µm that is formed in the above-described manner is used as a mask material, it is possible to prevent a crack from occurring in this resist pattern even in the case of ion implantation with ultrahigh energy of 6.0 MeV. In the ion implantation process in which a well is formed that is arranged in the portion to serve as the pixel array region of the photoelectric conversion device, the resist pattern 2i is used for boron B implantation with energy of 6 MeV and removed after the ion implantation.

As described above, according to the present embodiment, when a resist pattern having a large film thickness is formed, application, exposure, and development are performed in a divided manner with respect to the film thickness, and the resist pattern having a large film thickness is formed by performing these processes multiple times. Furthermore, among the multiple times of processes, at least the photoresist (pattern) of the lowermost layer is subjected to UV-curing after having been developed, thereby making it possible to produce a resist mask 2i that can withstand the ultrahigh energy ion implantation. Such a resist mask 2i can prevent the photoresist from being deformed and suppress occurrence of a crack at the time of ion implantation.

Embodiment 2

In Embodiment 1 of the above-described invention, the photoresist pattern of the uppermost layer is not subjected to UV curing processing. In contrast thereto, the present embodiment has the feature that the photoresist pattern of the uppermost layer is also subjected to UV curing processing.

As the UV curing processing that is performed on the photoresist pattern of the uppermost layer, corresponding to the present embodiment, it is possible to perform processing in which the level of ultraviolet curing is reduced relative to that of the processing performed on the lower layer. Reducing the level of ultraviolet curing is performed by lowering at least one value of the irradiation intensity, the irradiation time, and the atmospheric temperature (lowering the irradiation intensity, shortening the irradiation time, or reducing the atmospheric temperature). For example, the value can have the condition of being about ¾ or smaller, and may be ½ or smaller than the value in the first processing. The condition of the ultraviolet irradiation is determined in the range in which no crack occurs. For example, there is a method for making the thickness of the cured portion 2e on the surface of the photoresist thinner by reducing the irradiation amount to 300 W/cm$^2$ or smaller. Accordingly, it is possible to suppress the resist from shrinking at the time of ion implantation, and to make it difficult for a crack to occur.

Furthermore, it is possible to reduce processing temperature at the time of UV curing processing and shorten the irradiation time relative to those in the case of the photoresist of the lower layer. Specifically, the temperature can be reduced to, for example, 130° C. or lower that is lower than that of the processing performed on the lower layer. Furthermore, by shortening the heating time to 20 seconds or shorter, it is possible to reduce the amount of heat to be applied.

In the present embodiment, the photoresist of the uppermost layer is subjected to UV curing processing in which, at that time, at least one of the irradiation amount of ultraviolet light, the irradiation time with ultraviolet light, and the atmospheric temperature at the time of irradiation with ultraviolet light is reduced relative to that of the UV curing processing performed on the photoresist of the lower layer. Accordingly, it is possible to reduce the amount of gas released from the photoresist, making it possible to sufficiently suppress deformation such as hopping. Moreover, it is possible to suppress the resist from shrinking at the time of ion implantation, making it difficult for a crack to occur.

Embodiment 3

Hereinafter, Embodiment 3 of the present invention will be described. In Embodiments 1 and 2 above, the reticle that is used in patterning the photoresist after the second layer onward has the same pattern as that for the first layer. In contrast, the present embodiment has the feature that the photoresist pattern of the first layer is formed in the same manner as in Embodiment 1 or 2, and then a reticle that is different from that for the first layer is used for the second layer onward.

FIG. 3 shows a method for forming an ion implantation mask using a photoresist, in the semiconductor device manufacturing method, according to the present embodiment in order of processes. The processes from FIGS. 3A to 3D are the same as those in FIG. 2, and the corresponding reference numerals are given. In contrast thereto, in FIG. 3E, patterning is performed using a reticle 3a having a narrower opening than that of the reticle 2d used in FIG. 3B. Specifically, the diameter of the opening of the reticle 3a can be reduced relative to that of the opening of the reticle 2d by several µm. Accordingly, it is clear that exposure light 3b that has passed through the reticle 3a and to which the second photoresist film 2f is exposed has a range narrower than that of the exposure light that has passed through the reticle 2d in FIG. 3B. A part 3c of the second photoresist film exposed to the light has an area that is smaller than that of the part 2g in FIG. 2E and included in the part 2g when viewed in a plan view. This is to suppress misalignment between the first layer and the second layer and to avoid a difference in level between the first layer and the second layer, and with this process, as shown in FIG. 3F, a second photoresist pattern 3d is formed that covers the opening of the first layer after the second layer is developed. In FIG. 3F, it is clear that the side face of the opening of a photoresist pattern 3e is formed such that the cured portion 2e shown in FIG. 3C is covered with the second photoresist film that is secondly applied. That is, in Embodiments 1 and 2, as shown in FIG. 2F, the side face of the opening of the resist pattern 2i is formed by the first photoresist pattern (2b and 2e) and the second photoresist pattern 2h. However, in the present embodiment, the side face of the opening of the photoresist pattern 3e is formed only by the second photoresist pattern 3d.

By performing such patterning while overlapping the pattern of the second layer on that of the first layer, it is possible not only to prevent a crack from occurring but also to provide a margin with respect to misalignment between the first layer and the second layer. That is, in Embodiments 1 and 2, the position at which ion is implanted is located in the portion of union of the first layer pattern and the second layer pattern, but in the present embodiment, the position at which ion is implanted depends only on the pattern of the second layer, and thus it is possible to reproducibly perform implantation in a predetermined region.

Embodiment 4

The following will describe Embodiment 4 of the present invention. In the above-described embodiments, the types and the film thicknesses of the photoresists that are used in the first layer and the second layer onward are the same. In contrast thereto, the present embodiment has the feature that a first layer having the same photoresist pattern as that in Embodiment 1 or 2 is formed, and then a second layer onward are formed with photoresists that have different type and different film thickness from those of the photoresist used for the first layer.

FIG. 4 shows a method for forming an ion implantation mask using a photoresist according to the present embodiment in order of processes. The processes from FIGS. 4A to 4C are the same as those in FIG. 2, and the corresponding reference numerals are given. In contrast thereto, in FIG. 4D, a second photoresist film 4a is formed using a photoresist of the type different from that of the photoresist of the first photoresist film 2b formed in FIG. 4A. Then, the second photoresist film 4a is exposed using the reticle 2d. Accordingly, a part indicated by the reference numeral 4b of the second photoresist film 4a is exposed to light, and thus development processing is then performed. Accordingly, a second photoresist pattern 4c as shown in FIG. 4F is formed, making it possible to form a photoresist pattern 4d.

Although FIG. 4 illustrates the case in which the type of the photoresist is changed, the film thickness may as well be changed. For example, in order to bear the ion implantation with ultrahigh energy of 7.0 MeV, the resist film needs to have a thickness of 10 μm, but it is also possible that the first layer having a film thickness of 5.5 μm is applied and then the second layer having the film thickness larger than 5.5 μm, for example, 6.5 μm is applied.

Embodiment 5

Embodiment 1 has described a method for forming a photoresist pattern in which only the first photoresist pattern that is first formed is subjected to ultraviolet curing processing and the second photoresist pattern at least a part of which is formed on the first photoresist pattern is not subjected to ultraviolet curing processing. This method can be executed for the purpose of forming a photoresist pattern that can bear ultrahigh energy ion implantation but is not limited to this, and this method can also be executed as a method for forming a photoresist pattern for the purpose of suppressing a white defect. In the embodiments onward, the method for forming a photoresist pattern for the purpose of suppressing a white defect will be described specifically.

First, a photoelectric conversion device serving as a semiconductor device according to Embodiment 5 of the present invention will be described with reference to the drawings. Also in the present embodiment, a CMOS-type photoelectric conversion device will be described, but the type of the photoelectric conversion device is not limited to this. Furthermore, the present embodiment is also applicable to another semiconductor device.

Figure 5:
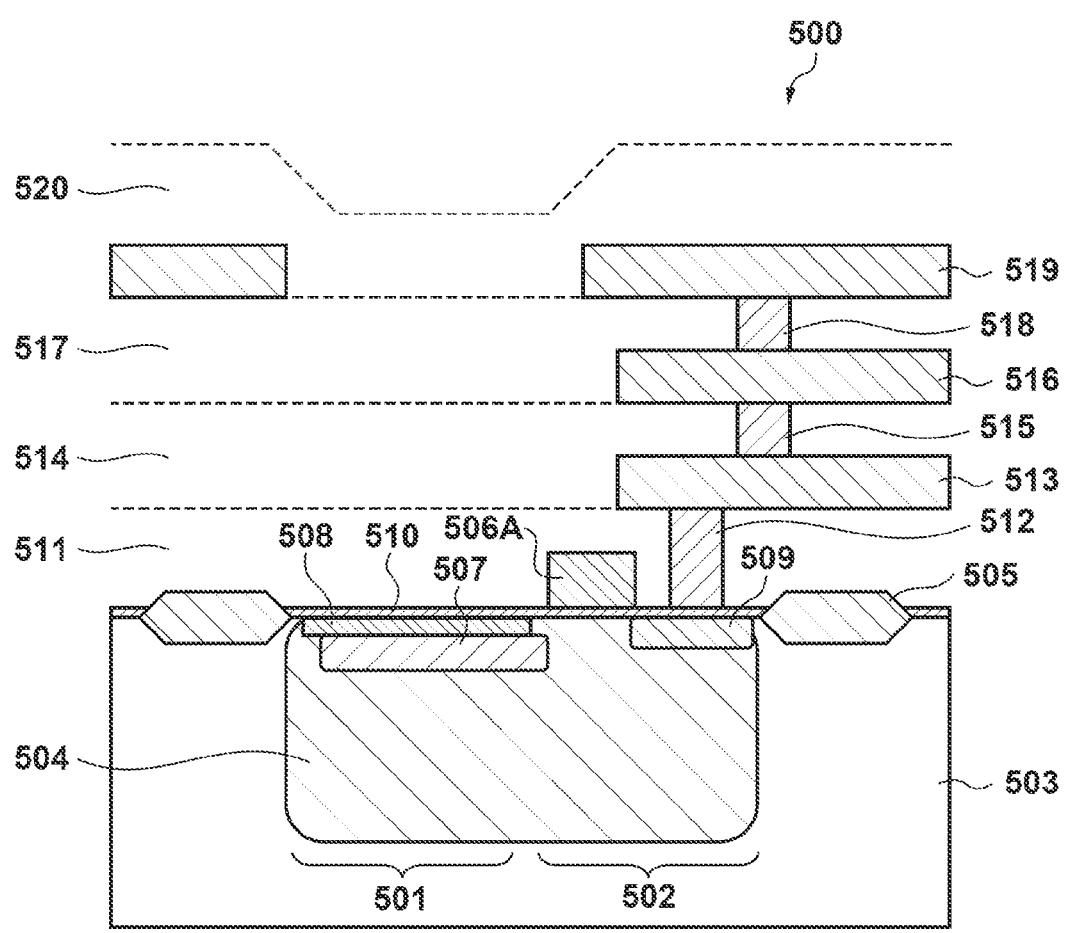
FIG. 5 schematically illustrates a method for manufacturing a semiconductor device according to Embodiment 5 of the present invention.

Similarly in the foregoing embodiments, the photoelectric conversion device that will be described in the present embodiment has a pixel array region and a peripheral region. FIG. 5 is a cross-sectional view schematically showing the photoelectric conversion device according to the present embodiment, and the photoelectric conversion device 500 at least includes a photoelectric conversion section 501 and a transfer MOS transistor section 502 for transferring a photoelectrically-converted electrical charge. More specifically, a P-type impurity region 504 is formed in a semiconductor substrate 503, and an N-type impurity region 507 for an electrical charge accumulation layer and a surface P-type impurity region 508 for configuring a buried photodiode structure are formed in the P-type impurity region 504. Furthermore, a gate oxide film 510 such as a silicon oxide film is formed on the semiconductor substrate 503. In the vicinity of the photoelectric conversion section 501 and the transfer MOS transistor section 502, an element isolation portion 505 made of a silicon oxide film is formed and the element is isolated from other elements. The transfer MOS transistor section 502 has a gate electrode 506A, and an electrical charge that is converted by the photoelectric conversion section 501 and accumulated in the N-type impurity region 507 is transferred to an N-type impurity region 509 that functions as floating diffusion.

Furthermore, on the semiconductor substrate 503, an interlayer insulating film 511, which insulates the gate electrode 506A from a first interconnect layer 513, and a first contact plug 512, which passes through the interlayer insulating film 511 and electrically connects the N-type impurity region 509 and the first interconnect layer 513, are formed. An interlayer insulating film 514 for insulating the first interconnect layer 513 from a second interconnect layer 516 is further formed on the interlayer insulating film 511, and a second contact plug 515 for electrically connecting the first interconnect layer 513 and the second interconnect layer 516 is formed in the interlayer insulating film 514. Furthermore, an interlayer insulating film 517 for insulating the second interconnect layer 516 from a third interconnect layer 519 is formed on the interlayer insulating film 514, and a third contact plug 518 for electrically connecting the second interconnect layer 516 and the third interconnect layer 519 is formed in the interlayer insulating film 517. Moreover, a passivation film 520, which is a surface protection layer, is formed so as to cover the third interconnect layer 519.

In the configuration shown in FIG. 5, light incident on the surface is converted into an electrical charge by the photoelectric conversion section 501, and the converted electrical charge is transferred to the N-type impurity region 509 by a pulse that is applied to the gate electrode 506A of the transfer MOS transistor and is output as a signal via the first contact plug 512 and the first interconnect layer 513.

FIG. 6 is a diagram illustrating examples of processes for manufacturing the gate electrode 506A of the transfer MOS transistor to the N-type impurity region 507, when the photoelectric conversion device 500 is manufactured by the CMOS process using an N-type silicon substrate as the semiconductor substrate 503.

Figure 6A:
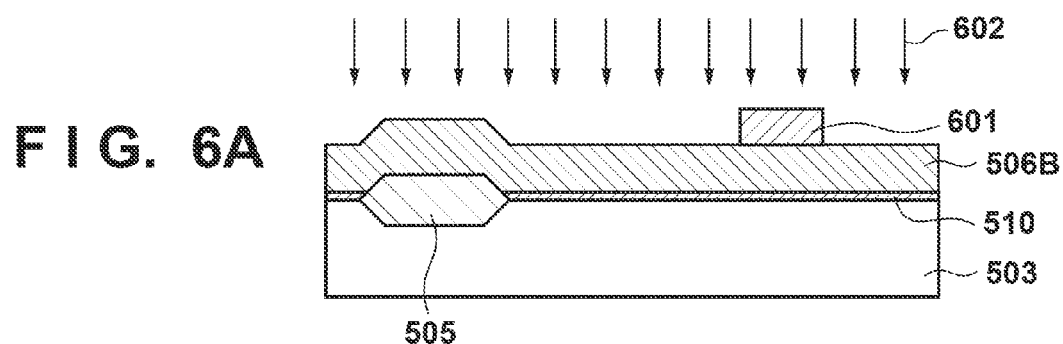
FIGS. 6A to 6E show processes for forming a resist pattern.
Figure 6B:
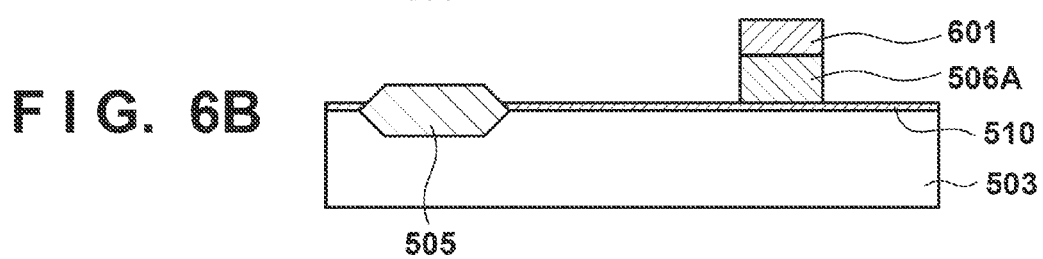

First, the element isolation portion 505 is formed of a silicon oxide film on the semiconductor substrate 503 in which the P-type impurity region 504 is formed, and then the gate oxide film 510 and a polycrystalline silicon film 506B are deposited in the stated order. Then, a resist is applied, exposed, and developed on the polycrystalline silicon film 506B to form a first photoresist pattern 601, and the first photoresist pattern is irradiated with ultraviolet light 602 and subjected to ultraviolet curing processing. The state at that time is shown in FIG. 6A. Then, the polycrystalline silicon film 506B is etched using the first photoresist pattern 601 as a mask, and is patterned to the same shape as in the first photoresist pattern 601. Accordingly, the gate electrode 506A is formed and the state shown in FIG. 6B is realized.

Figure 6C:
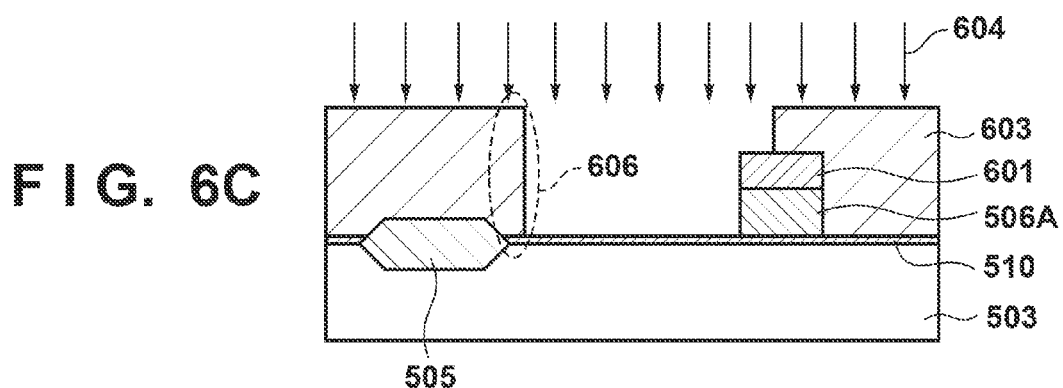
Figure 6D:
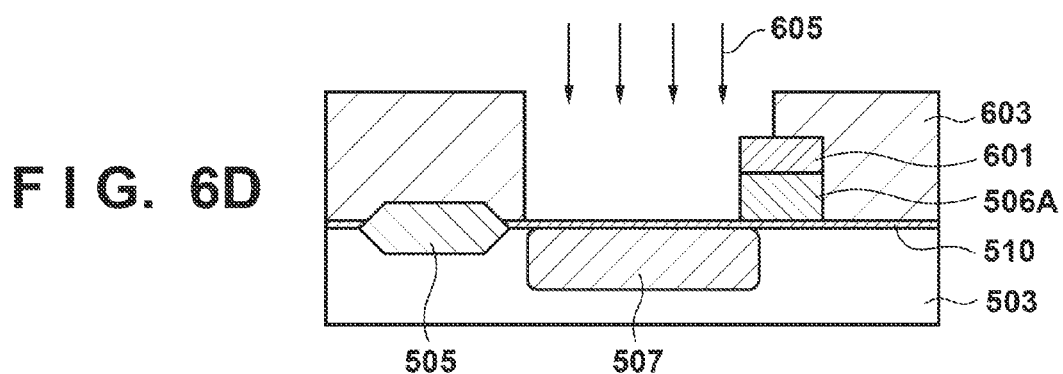
Figure 6E:
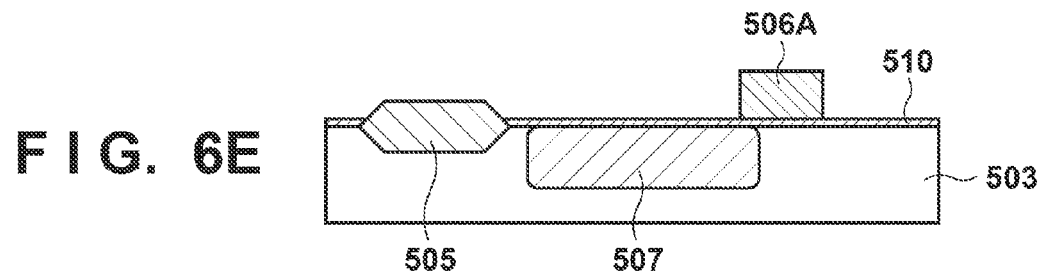

Then, the first photoresist pattern 601 is not removed and a second photoresist pattern 603 is formed that serves as a mask for ion implantation at the time of forming an electrical charge accumulation region. The second photoresist pattern 603 is formed so as to cover a part of the substrate and has an opening for forming the N-type impurity region 507, and an end of the photoresist that forms this opening is formed on the substrate. Then, the second photoresist pattern 603 is irradiated with ultraviolet light 604 and subjected to ultraviolet curing processing, in order to suppress outgas that will be generated from the photoresist in the ion implantation that is to be performed in post processing. The situation at that time is shown in FIG. 6C. Then, ion implantation 605 for forming the N-type impurity region is performed using the first photoresist pattern 601 and the second photoresist pattern 603 as masks. The state at that time is shown in FIG. 6D. Accordingly, the N-type impurity region 507 is formed. Ultimately, by removing the first photoresist pattern 601 and the second photoresist pattern 603 away, the state shown in FIG. 6E is realized.

In the above-described manufacturing process, when a photoresist mask is formed on the region in which the photoelectric conversion section 501 is to be formed, as shown in a circle 606 of FIG. 6C, and ultraviolet irradiation is performed, the shape of the end of the resist mask formed at the positon on the substrate that is surrounded by the circle 606 is no longer perpendicular. In this case, at the time of ion implantation that is to be performed thereafter, an ion beam that has transmitted through the photoresist mask will be implanted into the semiconductor substrate. At that time, a phenomenon that a metal atom contained in the photoresist is pushed out by the ion beam and implanted into the semiconductor substrate, which is generally called as knock-on, occurs. The knocked-on metal atom causes an increase in white defect. The reason why the end of the photoresist is arranged in an active region to form the electrical charge accumulation region is to prevent occurrence of a dark current. If the end of the photoresist pattern for forming an electrical charge accumulation region is located on the silicon oxide film for isolating elements, a dark current will occur by the electrical charge accumulation region and the silicon oxide film for isolating elements being in contact with each other. Furthermore, even in the case of element isolation when a photodiode is used as a focus detection device, two ends of a photoresist for forming an electrical charge accumulation layer are located in a region of a photoelectric conversion section, and this structure as well poses the problem of an increase in white defect.

Therefore, in the present embodiment, the second photoresist pattern 603 is not subjected to ultraviolet curing processing, and ion implantation for forming the N-type impurity region is performed using the first photoresist pattern 601 and the second photoresist pattern 603 as masks to form the photoelectric conversion section.

Figure 7A:
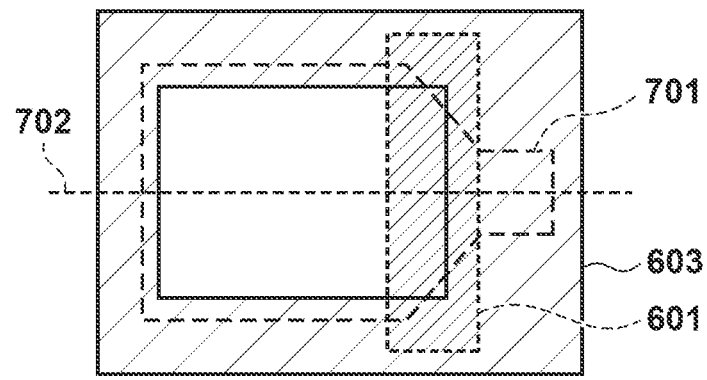
FIG. 7A is a diagram showing an example of a resist pattern of Embodiment 5 of the present invention.

More specifically, an example of manufacturing process for forming the N-type impurity region 507 is described with reference to the drawings. FIG. 7A is a diagram showing an example of a photoresist pattern for forming the N-type impurity region 507. Furthermore, FIG. 8 illustrates manufacturing processes for forming the N-type impurity region 507, with respect to the cross-section taken along a dotted line 702 in FIG. 7.

As shown in FIG. 7A, in the present embodiment, the photoresist pattern 601 for forming the gate electrode 506A of the transfer MOS transistor section 502 and the photoresist pattern 603 for forming the N-type impurity region 507 serving as the electrical charge accumulation region are formed. Note that a dotted line 701 indicates the border of the element isolation portion 505. As shown in FIG. 7A, the photoresist pattern 601 for the gate electrode 506A and the photoresist pattern 603 for the N-type impurity region 507 partially overlap each other. Furthermore, the photoresist pattern 603 has an opening for forming the N-type impurity region 507. The opening is provided in the active region inside of the border of the element isolation portion 505, in order to prevent a dark current that may be caused due to the electrical charge accumulation region and the element isolation portion being in contact with each other.

Figure 8A:
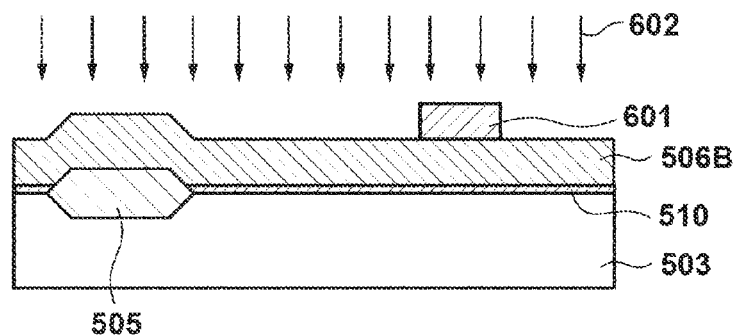
FIGS. 8A to 8D show processes for forming the resist pattern of Embodiment 5 of the present invention.

Hereinafter, processes for manufacturing such photoresist patterns will specifically be described with reference to FIG. 8. First, the element isolation portion 505 is formed on the semiconductor substrate 503 in which the P-type impurity region 504 is formed, and then the gate oxide film 510 and the polycrystalline silicon film 506B are deposited in the stated order. Then, a resist is applied, exposed and developed on the polycrystalline silicon film 506B to form the first photoresist pattern 601, and the first photoresist pattern 601 is irradiated with ultraviolet light 602 and subjected to ultraviolet curing processing. The state at that time is shown in FIG. 8A. The ultraviolet curing processing can here be executed, for example, with the irradiation intensity in the range from 800 to 1000 W/cm$^2$ and at an atmospheric temperature in the range from 130 to 200° C. The film thickness of the first photoresist pattern 601 can be, for example, in the range from 0.5 to 1.5 μm.

Figure 8B:
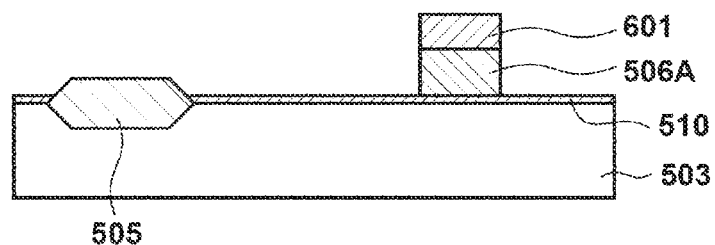

Then, the polycrystalline silicon film 506B is etched using the first photoresist pattern 601 as a mask, and is patterned to the same shape as in the first photoresist pattern 601. Accordingly, the gate electrode 506A is formed and the state shown in FIG. 8B is realized. Then, the first photoresist pattern 601 is not removed and the second photoresist pattern 603 is formed that serves as a mask for ion implantation at the time of forming the electrical charge accumulation region. At that time, the second photoresist pattern 603 is formed so as to cover a part of the substrate and has an opening for forming the N-type impurity region 507, and the end of the photoresist that is denoted by the circle 606 and forms the opening is formed on the substrate. The film thickness of the second photoresist pattern 603 can be, for example, in the range from 0.5 to 1.5 μm.

Figure 8C:
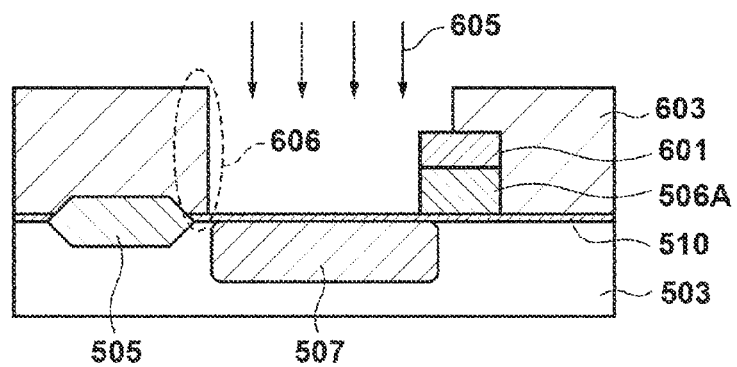
Figure 8D:
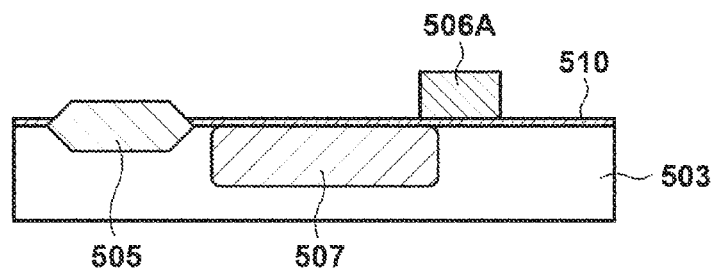

Then, the second photoresist pattern 603 is not irradiated with ultraviolet light, and the ion implantation 605 for forming the N-type impurity region is executed using the first photoresist pattern 601 and the second photoresist pattern 603 as masks. At that time, the ion implantation energy can be, for example, in the range from 300 to 600 KeV. The state at that time is shown in FIG. 8C. Ultimately, by removing the first photoresist pattern 601 and the second photoresist pattern 603 away, the state shown in FIG. 8D is realized.

According to the above-described photoresist mask formation method, since the second photoresist pattern 603 that is arranged in the region in which the photoelectric conversion section 501 is to be formed is not subjected to ultraviolet curing processing, the shape of the end of the photoresist will be kept perpendicular. Therefore, it is possible to prevent knock-on of a metal impurity in the photoresist, suppressing an increase in white defect.

Embodiment 6

Hereinafter, a photoelectric conversion device serving as a semiconductor device according to Embodiment 6 of the present invention will be described with reference to the drawings. The photoelectric conversion device according to the present embodiment also has the same cross-section as that of FIG. 5.

Also in a method for forming a photoresist mask according to the present embodiment, only a photoresist pattern for forming the gate electrode 506A is irradiated with ultraviolet light, and a photoresist pattern for forming the N-type impurity region 507 is not irradiated with ultraviolet light. However, in the present embodiment, as shown in FIG. 7B, N-type impurity regions 507 are formed adjacent to each other, and the photoresist pattern is formed between the adjacent N-type impurity regions 507.

More specifically, examples of processes for manufacturing the N-type impurity regions 507 will be described with reference to the drawings. FIG. 7B is a diagram showing an example of a photoresist pattern for forming the N-type impurity regions 507. Furthermore, FIG. 9 shows processes for manufacturing the N-type impurity regions 507, with respect to the cross-section taken along a dotted line 703 in FIG. 7B. Note that manufacturing processes shown with respect to the cross-section taken along the dotted line 702 are similar to the manufacturing processes that are shown in FIG. 8 and described in Embodiment 5.

Figure 7B:
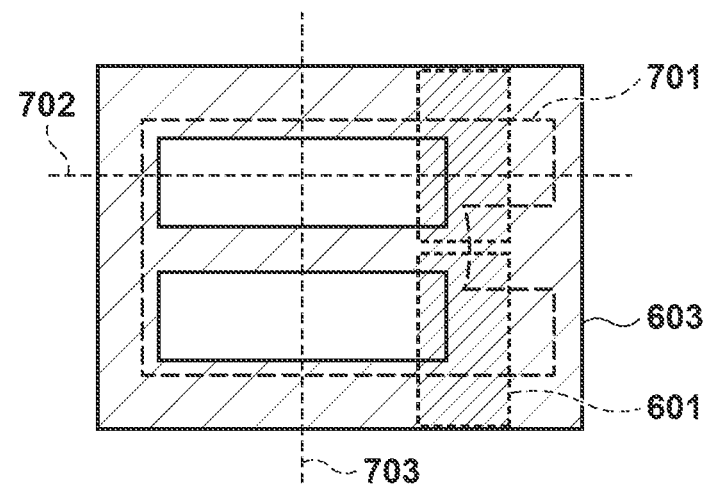
FIG. 7B is a diagram showing an example of a resist pattern according to Embodiment 6 of the present invention.

As shown in FIG. 7B, in the present embodiment, the photoresist pattern 601 for forming the gate electrode 506A of the transfer MOS transistor section 502 and photoresist pattern 603 for forming the N-type impurity regions 507 serving as the electrical charge accumulation regions are formed. Note that the dotted line 701 indicates the border line of the element isolation portion 505. As shown in FIG. 7B, the photoresist pattern 601 for the gate electrode 506A and the photoresist pattern 603 for the N-type impurity regions 507 partially overlap each other. Furthermore, the photoresist pattern 603 has two openings for forming the N-type impurity regions 507 adjacent to each other. In other words, the photoresist pattern for the electrical charge accumulation regions is arranged between the N-type impurity regions 507 that are photoelectric conversion regions. The two openings are formed inside of the border line 701, which indicates the border of the element isolation portion 505, in order to prevent a dark current that may be caused due to the electrical charge accumulation region and the element isolation portion being in contact with each other, and are adjacent to each other in the active region defined by the element isolation portion 505.

Figure 9A:
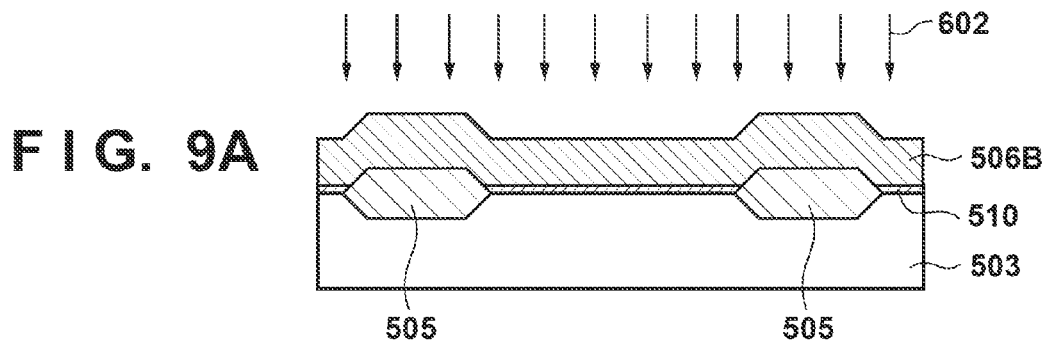
FIGS. 9A to 9D show processes for forming the resist pattern of Embodiment 6 of the present invention.

Hereinafter, processes for manufacturing such photoresist patterns will specifically be described with reference to FIG. 9. First, the element isolation portion 505 is formed on the semiconductor substrate 503 in which the P-type impurity region 504 is formed, and then the gate oxide film 510 and the polycrystalline silicon film 506B are deposited in the stated order. Then, a resist is applied, exposed and developed on the polycrystalline silicon film 506B to form the first photoresist pattern 601, and the first photoresist pattern 601 is irradiated with ultraviolet light and subjected to ultraviolet curing processing. The state at that time is shown in FIG. 9A. Note that since FIG. 9 shows the manufacturing processes with respect to the cross-section taken along the dotted line 703 in FIG. 7B, the first photoresist pattern 601 is not shown. The result, when viewed in the cross-section taken along the dotted line 702, is in the state shown in FIG. 8A.

Figure 9B:
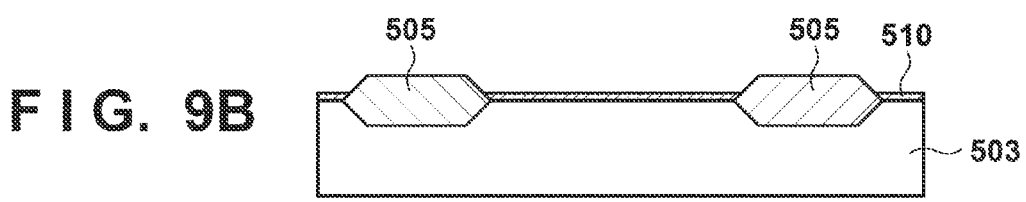

Then, the polycrystalline silicon film 506B is etched using the first photoresist pattern 601 as a mask, and is patterned to the same shape as in the first photoresist pattern 601. The state at that time is shown in FIG. 9B. Note that since FIG. 9 shows manufacturing processes with respect to the cross-section taken along the dotted line 703 in FIG. 7B, the polycrystalline silicon film 506B has been removed and thus not exist, and the first photoresist pattern 601 is not shown. The result, when viewed in the cross-section taken along the dotted line 702, is in the state shown in FIG. 8B. Here, the ultraviolet curing processing can be executed, for example, with the irradiation intensity in the range from 800 to 1000 W/cm$^2$ and at an atmospheric temperature in the range from 130 to 200° C. The film thickness of the first photoresist pattern 601 can be, for example, in the range from 0.5 to 1.5 μm.

Figure 9C:
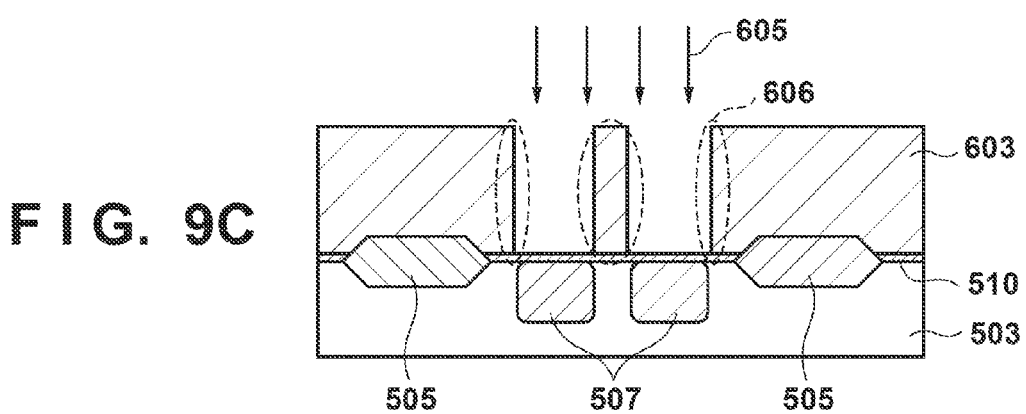
Figure 9D:
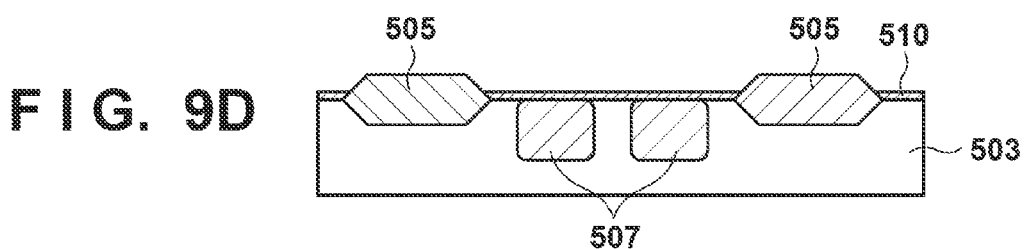

Then, the first photoresist pattern 601 is not removed and the second photoresist pattern 603 is formed that serves as a mask for ion implantation at the time of forming the electrical charge accumulation regions so as to form. The film thickness of the second photoresist pattern 603 can be, for example, in the range from 0.5 to 1.5 μm. At that time, the second photoresist pattern 603 is formed so as to cover a part of the substrate and has two adjacent openings for forming the N-type impurity regions 507 adjacent to each other, and the ends of the photoresist that are denoted by the circles 606 and form these openings are formed on the substrate while opposing each other for each opening. Then, the second photoresist pattern 603 is not irradiated with ultraviolet light, and the ion implantation 605 for forming the N-type impurity regions is executed using the first photoresist pattern 601 and the second photoresist pattern 603 as masks. At that time, the ion implantation energy can be in the range from 300 to 600 KeV. The state at that time is shown in FIG. 9C. Note that since FIG. 9 shows the manufacturing processes with respect to the cross-section taken along the dotted line 703 in FIG. 7B, the first photoresist pattern 601 is not shown. The result, when viewed in the cross-section taken along the dotted line 702, is in the state shown in FIG. 8C. Ultimately, by removing the first photoresist pattern 601 and the second photoresist pattern 603 away, the state shown in FIG. 9D is realized. Note that the result, when viewed in the cross-section taken along the dotted line 702, is in the state shown in FIG. 8D.

When, as shown in FIG. 7B, the second photoresist pattern 603 is formed so as to intersect the region in which the photoelectric conversion section 501 is to be formed, the area of the ends of the photoresist increases, which may cause an increase in the number of white defects. However, in the relevant region, the second photoresist pattern 603 that forms the ends of the photoresist is not irradiated with ultraviolet light and thus the shape of the resist can be kept perpendicular, making it possible to effectively prevent knock-on of a metal atom in the second photoresist pattern and suppress an increase in white defect.

Embodiment 7

The foregoing Embodiments 5 and 6 have described the cases where the second photoresist pattern 603 is not subjected to ultraviolet curing processing, but the present embodiment will describe the case where ultraviolet curing processing is executed with the conditions changed.

As the ultraviolet curing processing that is performed on the second photoresist pattern 603, corresponding to the present embodiment, it is possible to perform processing in which the level of ultraviolet curing is reduced relative to that of the processing performed on the first photoresist pattern 601. Reducing the level of ultraviolet curing is performed by lowering at least one value of the irradiation intensity, the irradiation time, and the atmospheric temperature (lowering the irradiation intensity, shortening the irradiation time, or reducing the atmospheric temperature). For example, the value can have the condition of being about ¾ or smaller, and may be ½ or smaller than the value in the first processing. The condition of the ultraviolet irradiation is determined in the range in which the shape of the resist does not change.

In the present embodiment, the second photoresist pattern 603 is subjected to ultraviolet curing processing in which, at that time, at least one of the irradiation amount of ultraviolet light, the irradiation time with ultraviolet light, and the atmospheric temperature at the time of irradiation with ultraviolet light is reduced relative to that in the processing performed on the first photoresist pattern 601. Accordingly, it is possible to prevent the shape of the resist from largely changing and to effectively prevent knock-on of a metal atom in the second photoresist pattern, suppressing an increase in white defect.

As described above, the embodiments of the present invention that enables a highly reliable mask material to be formed in the simple processes have been explained with reference to Embodiments 1 to 7. However, the embodiments of the present invention are not limited to the foregoing Embodiments 1 to 7, and suitable combination and modification thereof are also possible.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application Nos. 2014-084963, filed Apr. 16, 2014, and 2015-061661, filed Mar. 24, 2015 which are hereby incorporated by reference herein in their entirety.

What is claimed is:

1. A method for manufacturing a semiconductor device comprising:
    a first step of forming a first photoresist film on a substrate;
    a second step of forming a first photoresist pattern by exposing and then developing the first photoresist film;
    a third step of irradiating the first photoresist pattern with ultraviolet light to cure a surface of the first photoresist pattern;
    a fourth step of forming a second photoresist film so as to cover the substrate and the first photoresist pattern;
    a fifth step of forming a second photoresist pattern at least a part of which is provided on the first photoresist pattern by exposing and then developing the second photoresist film; and
    a sixth step of performing ion implantation in the substrate using the second photoresist pattern,
    wherein the second photoresist pattern is:
    (i) not subjected to ultraviolet irradiation after the second photoresist film has been developed and before the ion implantation is performed, or
    (ii) irradiated with the ultraviolet light, after the second photoresist film has been developed and before the ion implantation is performed, under a condition that at least one of an ultraviolet light irradiation amount, an ultraviolet light irradiation time, and an atmospheric temperature at the time of ultraviolet irradiation is reduced relative to that in the third step, and
    wherein, in the fifth step, a mask having an opening a diameter of which is smaller than that of an opening of a mask that is used in the second step is used.

2. A method for manufacturing a semiconductor device comprising:
    a first step of forming a first photoresist film on a substrate;
    a second step of forming a first photoresist pattern by exposing and then developing the first photoresist film;
    a third step of irradiating the first photoresist pattern with ultraviolet light to cure a surface of the first photoresist pattern;
    a fourth step of forming a second photoresist film so as to cover the substrate and the first photoresist pattern;
    a fifth step of forming a second photoresist pattern at least a part of which is provided on the first photoresist pattern by exposing and then developing the second photoresist film; and
    a sixth step of performing ion implantation in the substrate using the second photoresist pattern,
    wherein the second photoresist pattern is:
    (i) not subjected to ultraviolet irradiation after the second photoresist film has been developed and before the ion implantation is performed, or
    (ii) irradiated with the ultraviolet light, after the second photoresist film has been developed and before the ion implantation is performed, under a condition that at least one of an ultraviolet light irradiation amount, an ultraviolet light irradiation time, and an atmospheric temperature at the time of ultraviolet irradiation is reduced relative to that in the third step,
    wherein an opening that passes through the first photoresist pattern and the second photoresist pattern is formed in the second photoresist pattern in the first to fifth steps, and
    wherein a side face of the opening is formed only by the second photoresist pattern, among the first photoresist pattern and the second photoresist pattern.

3. A method for manufacturing a semiconductor device comprising:
- a first step of forming a first photoresist film on a substrate;
- a second step of forming a first photoresist pattern by exposing and then developing the first photoresist film;
- a third step of irradiating the first photoresist pattern with ultraviolet light to cure a surface of the first photoresist pattern;
- a fourth step of forming a second photoresist film so as to cover the substrate and the first photoresist pattern;
- a fifth step of forming a second photoresist pattern at least a part of which is provided on the first photoresist pattern by exposing and then developing the second photoresist film; and
- a sixth step of performing ion implantation in the substrate using the second photoresist pattern,
- wherein the second photoresist pattern is:
  (i) not subjected to ultraviolet irradiation after the second photoresist film has been developed and before the ion implantation is performed, or
  (ii) irradiated with the ultraviolet light, after the second photoresist film has been developed and before the ion implantation is performed, under a condition that at least one of an ultraviolet light irradiation amount, an ultraviolet light irradiation time, and an atmospheric temperature at the time of ultraviolet irradiation is reduced relative to that in the third step,
- wherein, in the sixth step, a photoelectric conversion region is formed in an active region surrounded by an element isolation portion formed in the substrate, and
- wherein the second photoresist pattern has, in the active region, an end that forms a part of a side face of an opening for forming the photoelectric conversion region.

4. The method according to claim 3,
- wherein, in the sixth step, a plurality of photoelectric conversion regions are formed in the same active region surrounded by the element isolation portion, and
- wherein the second photoresist pattern has, in the active region, ends that form parts of side faces of a plurality of openings for forming the plurality of photoelectric conversion regions in the same active region.

5. The method according to claim 4, wherein the second photoresist pattern includes parts that include, on face and rear sections thereof, ends forming a part of the respective side faces of the plurality of openings.

6. The method according to claim 3, wherein the end is formed perpendicular to the substrate.

7. The method according to claim 3, wherein the first photoresist pattern is used for forming a gate electrode of a transfer MOS transistor for transferring an electrical charge from the photoelectric conversion region.

8. A method for forming a resist pattern comprising:
- a first step of forming a first photoresist film on a substrate;
- a second step of forming a first photoresist pattern by exposing and then developing the first photoresist film;
- a third step of irradiating the first photoresist pattern with ultraviolet light to cure a surface of the first photoresist pattern;
- a fourth step of forming a second photoresist film so as to cover the substrate and the first photoresist pattern;
- a fifth step of forming a second photoresist pattern at least a part of which is provided on the first photoresist pattern by exposing and then developing the second photoresist film; and
- a sixth step of irradiating the second photoresist pattern with ultraviolet light to cure a surface of the second photoresist pattern,
- wherein, in the sixth step, at least one of an ultraviolet light irradiation amount, an ultraviolet light irradiation time, and an atmospheric temperature at the time of ultraviolet irradiation is reduced relative to that in the third step.

9. A method for forming a resist pattern comprising:
- a first step of forming a first photoresist film on a substrate;
- a second step of forming a first photoresist pattern by exposing and then developing the first photoresist film;
- a third step of irradiating the first photoresist pattern with ultraviolet light to cure a surface of the first photoresist pattern;
- a fourth step of forming a second photoresist film so as to cover the substrate and the first photoresist pattern; and
- a fifth step of forming a second photoresist pattern at least a part of which is provided on the first photoresist pattern by exposing and then developing the second photoresist film,
- wherein, in the fifth step, a mask having an opening a diameter of which is smaller than that of an opening of a mask that is used in the second step is used.

10. The method according to claim 9,
- wherein an opening that passes through the first photoresist pattern and the second photoresist pattern is formed in the second photoresist pattern in the first to fifth steps, and
- wherein a side face of the opening is formed by the first photoresist pattern and the second photoresist pattern.

* * * * *